US008489158B2

(12) United States Patent
Hum et al.

(10) Patent No.: US 8,489,158 B2
(45) Date of Patent: Jul. 16, 2013

(54) TECHNIQUES FOR MARKING TRANSLUCENT PRODUCT HOUSINGS

(75) Inventors: Phillip Wing-Jung Hum, San Francisco, CA (US); David Pakula, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 12/794,497

(22) Filed: Jun. 4, 2010

(65) Prior Publication Data

US 2011/0253411 A1   Oct. 20, 2011

Related U.S. Application Data

(60) Provisional application No. 61/325,796, filed on Apr. 19, 2010.

(51) Int. Cl.
*H04M 1/00* (2006.01)
(52) U.S. Cl.
USPC .................. 455/575.3; 174/50; 455/575.8
(58) Field of Classification Search
USPC ............... 174/50, 66, 67; 220/4.02, 241, 242; 455/575.1, 575.3, 575.8
See application file for complete search history.

(56) References Cited

U.S. PATENT DOCUMENTS

| 2,647,079 | A |   | 7/1953 | Burnham |
|---|---|---|---|---|
| 3,526,694 | A |   | 9/1970 | Lemelson |
| 4,269,947 | A |   | 5/1981 | Inata et al. |
| 4,479,317 | A | * | 10/1984 | Hanna ........................ 40/299.01 |
| 4,531,705 | A |   | 7/1985 | Nakagawa et al. |
| 4,547,649 | A |   | 10/1985 | Butt et al. |
| 4,564,001 | A |   | 1/1986 | Maeda |
| 4,993,148 | A |   | 2/1991 | Adachi et al. |
| 5,417,905 | A |   | 5/1995 | Lemaire et al. |
| 5,837,086 | A |   | 11/1998 | Leeb et al. |
| 5,872,699 | A |   | 2/1999 | Nishii et al. |
| 5,925,847 | A |   | 7/1999 | Rademacher et al. |
| 6,101,372 | A |   | 8/2000 | Kubo |
| 6,331,239 | B1 |   | 12/2001 | Shirota et al. |
| 6,480,397 | B1 |   | 11/2002 | Hsu et al. |
| 6,574,096 | B1 |   | 6/2003 | Difonzo et al. |
| 6,966,133 | B2 |   | 11/2005 | Krings et al. |
| 6,996,425 | B2 |   | 2/2006 | Watanabe |

(Continued)

FOREIGN PATENT DOCUMENTS

DE   195 23 112   6/1996
EP   0 114 565 A1   8/1984

(Continued)

OTHER PUBLICATIONS

"UV—Curing Sheet Adhesives", ThreeBond Technical News, Issued Jul. 1, 2009, 8 pages.

(Continued)

*Primary Examiner* — Dhirubhai R Patel

(57) ABSTRACT

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include a housing surface and the markings can be provided on the housing surface such that the marking are visible to users of the products. The products can be electronic devices (e.g., portable electronic devices).

22 Claims, 4 Drawing Sheets

U.S. PATENT DOCUMENTS

| | | |
|---|---|---|
| 7,134,198 B2 | 11/2006 | Nakatani et al. |
| 7,181,172 B2 | 2/2007 | Sullivan et al. |
| 7,225,529 B2 | 6/2007 | Wang |
| 7,459,373 B2 | 12/2008 | Yoo |
| 7,622,183 B2 | 11/2009 | Shirai et al. |
| 7,691,189 B2 | 4/2010 | En et al. |
| 8,165,647 B2 * | 4/2012 | Cho et al. .................. 455/575.3 |
| 8,192,815 B2 | 6/2012 | Weber et al. |
| 8,367,304 B2 | 2/2013 | Heley et al. |
| 8,379,678 B2 | 2/2013 | Zhang et al. |
| 8,379,679 B2 | 2/2013 | Zhang et al. |
| 2002/0097440 A1 | 7/2002 | Paricio et al. |
| 2002/0109134 A1 | 8/2002 | Iwasaki et al. |
| 2002/0130441 A1 | 9/2002 | Robinson et al. |
| 2002/0160145 A1 | 10/2002 | Bauhoff |
| 2003/0006217 A1 | 1/2003 | Dance |
| 2005/0023022 A1 | 2/2005 | Kriege et al. |
| 2005/0034301 A1 | 2/2005 | Wang |
| 2005/0115840 A1 | 6/2005 | Dolan |
| 2005/0158576 A1 | 7/2005 | Groll |
| 2006/0055084 A1 | 3/2006 | Yamaguchi et al. |
| 2006/0066771 A1 | 3/2006 | Hayano et al. |
| 2006/0105542 A1 | 5/2006 | Yoo |
| 2007/0018817 A1 | 1/2007 | Marmaropoulos et al. |
| 2007/0045893 A1 | 3/2007 | Asthana et al. |
| 2007/0053504 A1 | 3/2007 | Sato et al. |
| 2007/0275263 A1 | 11/2007 | Groll |
| 2009/0017242 A1 | 1/2009 | Weber et al. |
| 2009/0104949 A1 | 4/2009 | Sato et al. |
| 2009/0190290 A1 | 7/2009 | Lynch et al. |
| 2009/0236143 A1 | 9/2009 | Nakamura |
| 2009/0260871 A1 | 10/2009 | Weber et al. |
| 2009/0305168 A1 | 12/2009 | Heley et al. |
| 2010/0065313 A1 | 3/2010 | Takeuchi et al. |
| 2010/0294426 A1 | 11/2010 | Nashner |
| 2011/0051337 A1 | 3/2011 | Weber et al. |
| 2011/0193928 A1 | 8/2011 | Zhang et al. |
| 2011/0193929 A1 | 8/2011 | Zhang et al. |
| 2011/0194574 A1 | 8/2011 | Zhang et al. |
| 2011/0315667 A1 | 12/2011 | Reichenback et al. |
| 2012/0043306 A1 | 2/2012 | Howerton et al. |
| 2012/0100348 A1 | 4/2012 | Brookhyser et al. |
| 2012/0152587 A1 * | 6/2012 | Lemire et al. .................. 174/66 |

FOREIGN PATENT DOCUMENTS

| | | |
|---|---|---|
| EP | 0 633 585 A | 1/1995 |
| GB | 788 329 A | 12/1957 |
| JP | 03 013331 A | 1/1991 |
| JP | 03 138131 A | 6/1991 |
| JP | 06-126192 | 5/1994 |
| JP | 2000-000167 | 1/2000 |
| JP | 2008 087409 A | 4/2008 |
| WO | EP 0 997 958 A1 | 5/2000 |
| WO | WO 01/34408 | 5/2001 |
| WO | WO 2006/124279 A2 | 11/2006 |

OTHER PUBLICATIONS

Annerfors et al., "Nano Molding Technology on Cosmetic Aluminum Parts in Mobile Phones", Division of Production and Materials Engineering, LTH, 2007.

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

* cited by examiner

TECHNIQUES FOR MARKING TRANSLUCENT PRODUCT HOUSINGS

CROSS-REFERENCE TO RELATED APPLICATION

This application claims priority benefit of U.S. Provisional Application No. 61/325,796, filed Apr. 19, 2010 and entitled "TECHNIQUES FOR MARKING TRANSLUCENT PRODUCT HOUSINGS," which is hereby incorporated herein by reference.

BACKGROUND OF THE INVENTION

1. Field of the Invention

The present invention relates to marking products and, more particularly, marking translucent housing surfaces of electronic devices.

2. Description of the Related Art

Consumer products, such as electronic devices, have been marked with different information for many years. For example, it is common for electronic devices to be marked with a serial number, model number, copyright information and the like. Conventionally, such marking is done with an ink printing or stamping process. Although conventional ink printing and stamping is useful for many situations, such techniques can be inadequate in the case of handheld electronic devices. The small form factor of handheld electronic devices, such as mobile phones, portable media players and Personal Digital Assistants (PDAs), requires that the marking be very small. In order for such small marking to be legible, the marking must be accurately and precisely formed. Unfortunately, however, conventional techniques are not able to offer sufficient accuracy and precision. Additionally, the marking should be durable and resistant to damage from abrasions and the like which handheld electronic devices tend to endure. Thus, there is a need for improved techniques to mark products.

SUMMARY

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include a housing surface and the markings can be provided on the housing surface such that the marking are visible to users of the products. The products can be electronic devices (e.g., portable electronic devices).

In general, the markings, or annotations, provided on products can be textual and/or graphic. The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

One aspect described herein provides product marking using Physical Vapor Deposition (PVD) of metal. Here, PVD processing can be used to deposit metal layer onto a housing surface of a product, e.g., an electronic device. The metal can be further processed to yield the desired marking on the housing surface. In one embodiment, the housing surface on which the PVD process deposits the metal layer is a glass outer housing member. Although the metal layer can be deposited on either an inside or outside of the glass outer housing member, it can be advantageous to provide the metal layer, and thus the eventual marking, on the inside of the glass outer housing.

The invention can be implemented in numerous ways, including as a method, system, device, or apparatus. Several embodiments of the invention are discussed below.

In one embodiment, a method for marking an electronic device housing can, for example, include at least the acts of depositing a layer of metal onto at least a portion of a translucent outer housing member of the electronic device housing, applying a mask layer over select portions of the deposited layer of metal, and etching away those portions of the metal layer not protected by the mask layer.

In another embodiment, a method for marking an electronic device housing can, for example, include at least the acts of depositing a layer of metal onto at least a portion of an inner surface of a glass outer housing member of the electronic device housing, applying a mask layer over select portions of the deposited layer of metal, and etching away those portions of the metal layer not protected by the mask layer. The remaining portions of the metal layer that remain on the inner surface of the glass outer housing member can serve to provide marking for the electronic device housing.

In another embodiment, an electronic device housing can, for example, include at least a translucent cover including an inner surface and an outer surface, where the outer surface provides a first surface for the electronic device housing; and marks formed on the inner surface of the translucent cover but visible from the outer surface of the translucent cover.

In another embodiment, an electronic device housing can, for example, include at least an outer periphery member defining a side surface for the electronic device enclosure, and an internal structure secured to an inner surface of the outer periphery member. The internal structure can be offset from first and second planar boundaries of the outer periphery member. The electronic device housing can also include a glass cover placed and secured adjacent the first planar boundary of the outer peripheral boundary. The glass cover can include an inner surface and an outer surface, where the outer surface provides a first surface for the electronic device housing. Additionally, marks can be formed on the inner surface of the glass cover with such marks being visible from the outer surface of the glass cover.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS OF THE INVENTION

Figure 1:
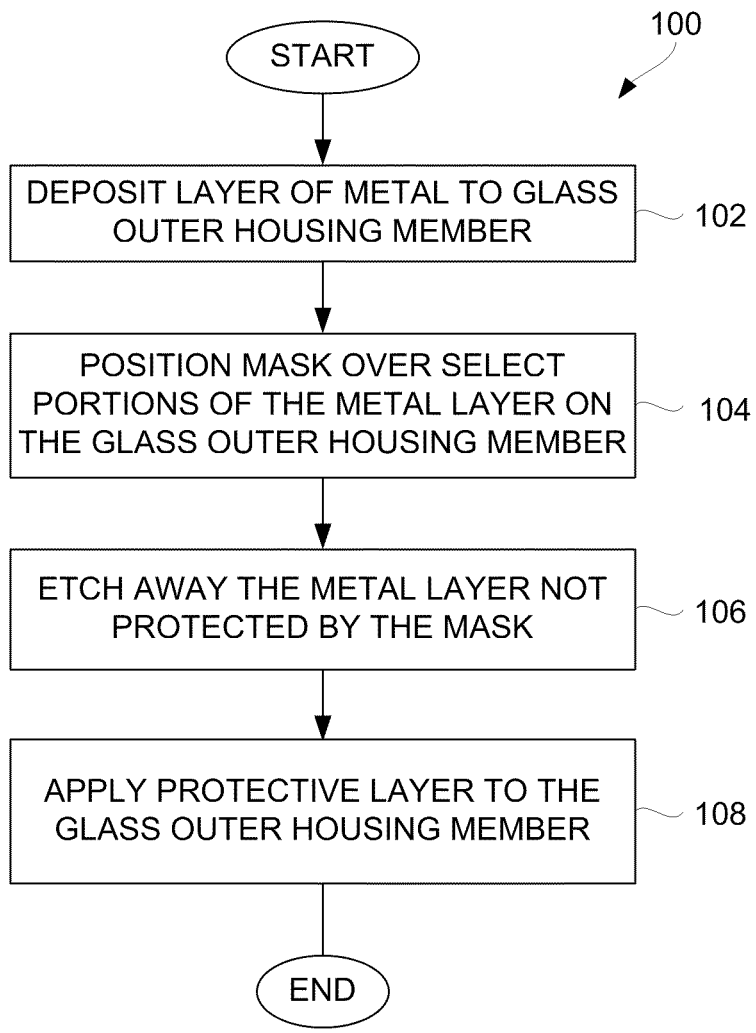
FIG. 1 is a process flow diagram for product marking process according to one embodiment.

Techniques or processes for providing markings on products are disclosed. The markings provided on products can be textual and/or graphic. The techniques or processes can provide high resolution markings on surfaces that are flat or curved. In one embodiment, the products have housings and the markings are to be provided on the housings. For example, the housing for a particular product can include a housing surface and the markings can be provided on the housing surface such that the marking are visible to users of the products. The products can be electronic devices (e.g., portable electronic devices).

In general, the markings, or annotations, provided on products can be textual and/or graphic. The marking can be provided for informational, cosmetic and/or functional reasons.

The markings can be used to provide a product (e.g., a product's housing) with certain information. The marking can, for example, be use to label the product with various information. When a marking includes text, the text can provide information concerning the product (e.g., electronic device). For example, the text can include one or more of: name of product, trademark or copyright information, design location, assembly location, model number, serial number, license number, agency approvals, standards compliance, electronic codes, memory of device, and the like. When a marking includes a graphic, the graphic can pertain to a logo, a certification mark, standards mark or an approval mark that is often associated with the product. The marking can be used for advertisements to be provided on products. The markings can also be used for customization (e.g., user customization) of a housing of a product.

The marking can be used for cosmetic effects. For example, the cosmetic effects can be user personalization or customization of an appearance of one or more outer surfaces of a housing of a product (e.g., an electronic device housing). For example, a personalization or customization can be an engraving, artwork (e.g., photos, sketches, patterns, or other text or graphics to be provided on an outer surface of a housing. The marking can also be used to render at least a portion of a translucent housing member opaque.

The marking can also be used for functional purposes. Since the marking can be provided by an electrically useful component, such as a metal, the marking can serve a functional purpose. The markings can, for example, serve as an antenna, a radio frequency shield, a switch or button, a sensor, an electrical connection, a capacitor, a resistor, etc. Also, it should be noted that marking provided for functional purposes (and not provided for marking or cosmetic reasons) need not be visible by a user of the product, and thus need not be on an outer surface of a product's housing.

Embodiments of the invention are discussed below with reference to FIGS. 1-4. However, those skilled in the art will readily appreciate that the detailed description given herein with respect to these figures is for explanatory purposes as the invention extends beyond these limited embodiments. The illustrations provided in these figures are not necessarily drawn to scale; instead, the illustrations are presented in a manner to facilitate presentation.

One aspect described herein provides product marking using Physical Vapor Deposition (PVD) of metal. Here, PVD processing can be used to deposit metal layer onto a housing surface of a product, e.g., an electronic device. The metal can be further processed to yield the desired marking on the housing surface. In one embodiment, the housing surface on which the PVD process deposits the metal layer is a glass outer housing member. Although the metal layer can be deposited on either an inside or outside of the glass outer housing member, it can be advantageous to provide the metal layer, and thus the eventual marking, on the inside of the glass outer housing. By providing the marking provided in the inside of the glass outer housing, the marking remains clearly visible yet is inherently protected from normal usage conditions which can damage the marking.

FIG. 1 is a process flow diagram for product marking process 100 according to one embodiment. The product marking process 100 is, for example, suitable for applying text or graphics to a housing surface (e.g., an outer housing surface) of an electronic device. The product marking process 100 is, in one embodiment, particularly well-suited for applying text and/or graphics to an outer housing surface of a handheld electronic device. Examples of handheld electronic devices include mobile telephones (e.g., cell phones), Personal Digital Assistants (PDAs), portable media players, remote controllers, pointing devices (e.g., computer mouse), medical devices, game controllers, etc.

The product marking process 100 operates to mark an outer housing surface of an electronic device. The product marking process 100 is a multi-step process to form high resolution text or graphics onto the outer housing surface. The outer housing surface can be flat or curved. In one embodiment, the outer housing surface being marked is a translucent outer housing member, such as a glass outer housing member.

Initially, the product marking process 100 deposits 102 a metal layer to a glass outer housing member of an electronic device housing. For example, the metal layer can be deposited 102 by a deposition process, such as sputtering. One suitable process for the deposition of the layer of material is a Physical Vapor Deposition (PVD) process. The metal layer being deposited can vary depending upon application. However, one suitable layer of material is a layer of metal, such as silver. Alternatively, the layer of material can be a layer of tin, aluminum or other material that can be applied with a deposition process. The use of metals facilitates markings that are metallic and reflective for superior visual appearance.

Next, a mask can be positioned 104 over select portions of the metal layer on the glass outer housing member. The mask can, for example, be a masking film. The mask, for example, can be formed from any material (e.g., a resist material) usable with a lithographic process used to form the mask. As one example, the mask can be polyimide. As another example, the mask can be a polyester or epoxy resin based ink.

Those portions of the metal layer not protected by the mask can then be etched 106. In one embodiment, the etching can be a chemical etch. For example, an acid can be used to perform the chemical etching. The acid cuts or removes away those portions of the metal layer that are unprotected by the mask. In an alternative embodiment, the etching can be achieved with an ablation process which can also be used to remove those portions of the metal layer that are not desired. The ablation process can be performed using a laser which can be precisely controlled to providing the etching of the metal layer. Through proper control of the laser, the ablation process of undesired portion of the metal layer of material can be removed without damaging the surface of the outer surface member. In the case of ablation, a mask is not needed.

Thereafter, if desired, a protective layer can be applied 108 to the outer housing surface so as to cover and protect the remaining layer of material that provides the graphical elements and/or textual elements on the outer housing surface that serve to mark the product. The protective later can seal the metal layer from undesired chemical reactions. In one embodiment, the protective cover can be provided by a layer of ink. One example of a suitable is a polyester ink (e.g., polyester resin-based ink). In another embodiment, the protective cover can be provided by a layer of acrylic. The protective layer can serve to provide a cosmetic shielding of the glass outer housing member. For example, the ink can be any color (e.g., black) and provide a partial or full shielding effect to the glass outer housing member. In any case, the marking provided by the select portions of the metal layer remaining can be visually distinguishable from the general cosmetic shielding. As an example, the metal later can be silver in color and the cosmetic shielding provided by a black ink. Following the block 108, the product marking process 100 can end.

FIGS. 2A-2E are diagrams detailing a product marking process according to one embodiment. The product marking process shown in FIGS. 2A-2E pertains to one embodiment of the product marking process 100 illustrated in FIG. 1. As previously noted, the illustrations provided in FIGS. 2A-2E are not necessarily drawn to scale; instead, the illustrations are presented in a manner to facilitate presentation.

Figure 2A:
FIGS. 2A-2E are diagrams detailing a product marking process according to one embodiment.

FIG. 2A is a diagram illustrating a housing portion 200. The housing portion 200 can represent a portion of a product housing, such as an outer housing of an electronic device. The housing portion 200 can represent an outer housing portion of the electronic device. The housing portion 200 can be translucent. As an example, the housing portion 200 can be made of glass.

Figure 2B:
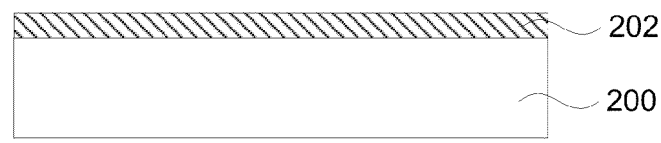

FIG. 2B is a diagram illustrating the housing portion 200 having a metal layer 202 deposited thereon. The metal layer 202 can, for example, be applied through a sputtering technique, such as through Physical Vapor Deposition (PVD). Also, as an example, the metal layer can be silver, aluminum, tin or other material than can de deposited using a PVD process. In one implementation, the thickness of the metal layer 202 is less than about one (1) micrometer, such as about fifty (50) nanometers.

Figure 2C:
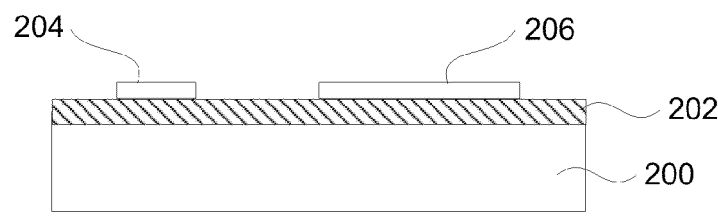

FIG. 2C is a diagram illustrating a mask 204, 206 selectively applied over the metal layer 202 on the housing portion 200. The mask 204, 206 can provide a predetermined pattern for marking of the product housing. The marking can pertain to text and/or graphics applied to the housing. For example, the mask 204 can correspond to text to be placed on the housing portion 200, and the mask 206 can correspond to a graphic to be placed on the housing portion 200. The mask 204, 206 can be applied over the metal layer 202 on the housing portion 200 in a variety of ways. In one embodiment, the mask 204, 206 can be applied as a film. In another embodiment, the mask 204, 206 can be pad printed on the housing portion 200. In still another embodiment, the mask 204, 206 can be silk screened onto the housing portion 200. In yet another embodiment, the mask 204, 206 can be printed, such as with an ink jet printing device, onto the housing portion 200. The mask 204, 206 protects portions of the metal layer 202 from a subsequent etch process. The mask 204, 206 can be any of a variety of materials that provide protection during etching. As one example, the mask 204, 206 can be a polyester ink or an epoxy resin based ink. In one implementation, the thickness of the mask 204, 206 is about two (2) to fifteen (15) micrometers.

Figure 2D:
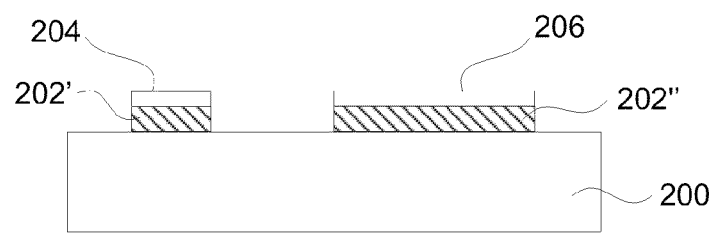

FIG. 2D is a diagram illustrating the housing portion 200 after an etch process has been applied. For example, an acid solution can be used to etch off those portions of the metal layer 202 that are not covered by the mask 204, 206. As a result, the exposed metal layer 202 is removed (e.g., etched away) from the housing portion 200.

Figure 2E:
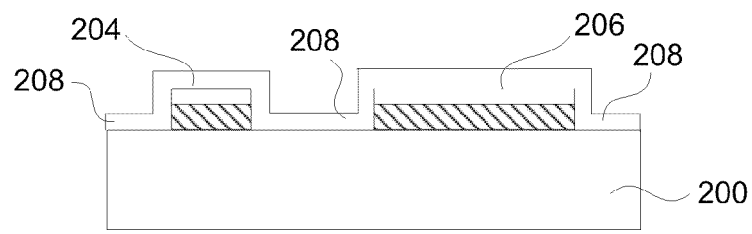

FIG. 2E is a diagram illustrating the housing portion 200 after a protective coating 208 is applied over the housing portion 200 and the remaining portions of the metal layer 202 and the mask 204, 206. The protective coating 208 can cover and protect the remaining metal layer 202 that remains on the housing portion 200 and which provides the graphical elements and/or textual elements on the housing that serve to mark the product. The protective later can seal the metal layer from undesired chemical reactions. In one embodiment, the protective cover can be provided by a layer of ink. One example of a suitable is a polyester-based ink. In another embodiment, the protective cover can be provided by a layer of acrylic.

The thickness of the housing portion 200, the metal layer and the mask 204, 206 can vary with implementation. Often, the thicknesses are rather thin. In one implementation, the housing portion 200 has a thickness of less than or equal to about 5 mm, in another implementation has a thickness of less than or equal to about 1 mm, in still another embodiment has a thickness of less than or equal to about 0.5 mm, and in still another embodiment has a thickness of less than or equal to about 0.3 mm. In one embodiment, the thickness of the metal layer is less than or equal to 1 mm. In one embodiment, the thickness of the mask 204, 206 is less than or equal to 1 mm.

Marking is rendered more complicated when the surface to be marked has curvature. However, the product marking process according to the invention is suitable for use on flat, curved or complex surfaces.

Figure 3A:
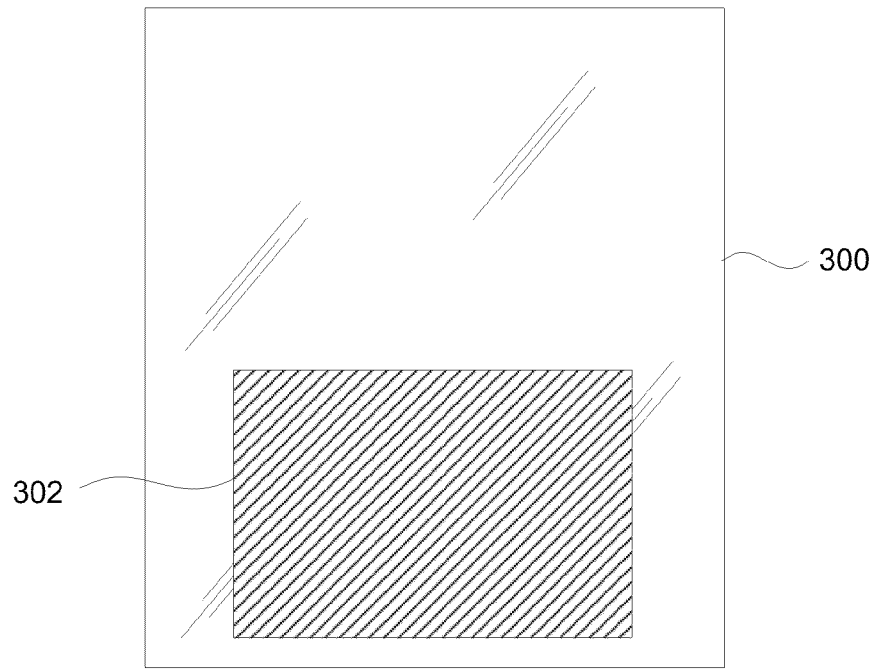
FIGS. 3A and 3B are diagrams illustrating exemplary marking of a product in accordance with one embodiment of a product marking process.
Figure 3B:
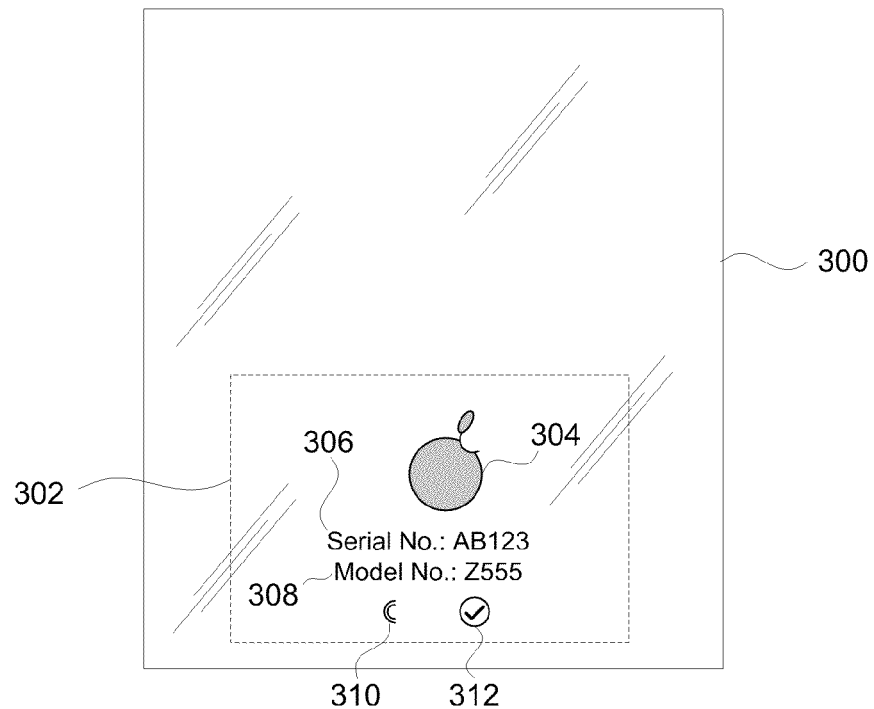

FIGS. 3A and 3B are diagrams illustrating exemplary marking of a product in accordance with one embodiment of a product marking process, such as the product marking process shown in FIGS. 2A-2E or the product marking process 100 illustrated in FIG. 1.

FIG. 3A illustrates a product housing 300 according to one embodiment. The product housing 300 being illustrated can represent one surface, such as back surface, of a handheld electronic device. A predetermined region 302 of the illustrated surface can be coated or covered with a layer of material to be used for marking. A masking layer can be used to confine the layer of material to the predetermined region 302.

FIG. 3B illustrates the product housing 300 after portions of the layer of material in the predetermined region 302 has been etched away to yield the desired labeling. In this example, the labeling includes a logo graphic 304, serial number 306, model number 308, and certification/approval marks 310 and 312.

In one embodiment, the product marking techniques discussed herein can be used to provide markings on a portable electronic device. The portable electronic device can further be a hand-held electronic device. The term handheld generally means that the electronic device has a form factor that is small enough to be comfortably held in one hand. A handheld electronic device may be directed at one-handed operation or two-handed operation. In one-handed operation, a single hand is used to both support the device as well as to perform operations with the user interface during use. In two-handed operation, one hand is used to support the device while the other hand performs operations with a user interface during use or alternatively both hands support the device as well as perform operations during use. In some cases, the hand-held electronic device is sized for placement into a pocket of the user. By being pocket-sized, the user does not have to directly carry the device and therefore the device can be taken almost anywhere the user travels (e.g., the user is not limited by carrying a large, bulky and often heavy device).

Figure 4:
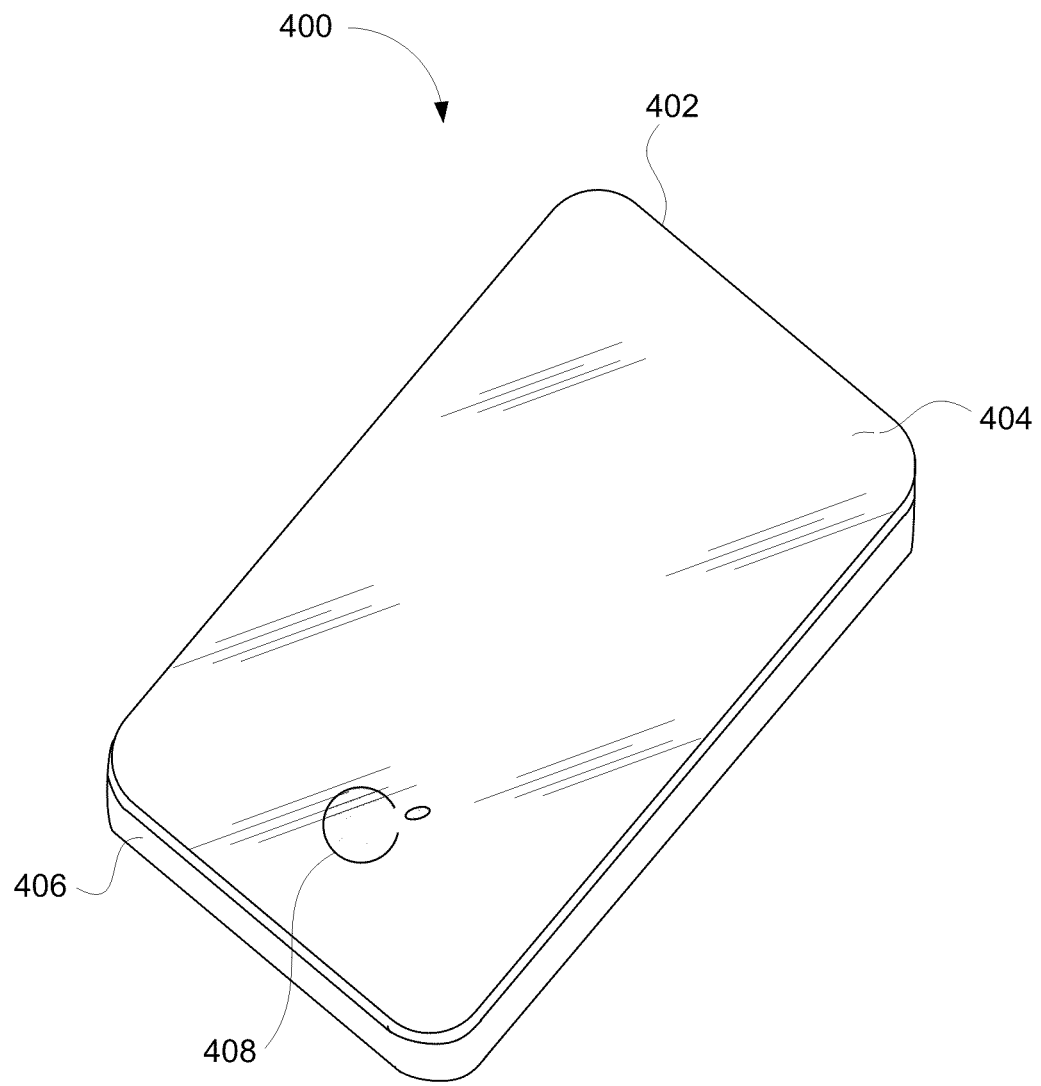
FIG. 4 is a perspective diagram of an exemplary portable electronic device according to one embodiment.

The marking techniques discussed herein can be used with products, such as electronic device, of various sizes, shapes and configurations. FIG. 4 is a perspective diagram of an exemplary electronic device being marked in accordance with one embodiment. However, it should be understood that, in other embodiments, the size, scale, shape, configuration and/or appearance of the portable electronic device 100 can vary widely.

FIG. 4 is a perspective diagram of an exemplary portable electronic device 400 according to one embodiment. The portable electronic device 400 is a representative illustration for a portable electronic device. The portable electronic device 400 includes a housing 402 that provides an exterior surface for the portable electronic device 400.

The housing include an outer housing member 404. Typically, the outer housing member 404 is translucent. For example, in one embodiment, the outer housing member 404 can be a glass outer housing member. The outer housing member 404 can for a front or back surface for the portable electronic device 400. The outer glass member 404 can be attached to a structure housing member 406 for the portable electronic device 400. The structural housing member 406 provides additional structural support for the portable electronic device 400 and can also serve to enclose various components used to provide the portable electronic device with functionality capabilities.

Using the marking techniques described herein, a mark 408, which in this example is a graphic (e.g., logo) can be formed on an inner surface of the outer housing member 404. However, since the outer housing member 404 is translucent, the mark 408 is visible from external to the housing 402. The mark 408 can have high resolution and can be protected from usage damage since it is provided on the inner surface of the outer housing member 404.

The portable electronic device 400 can provide one or more functional capabilities that can be utilized by its user. In so doing, the portable electronic device can include at least one input/output component (not shown). The user input/output component typically includes one or more user input devices and/or one or more output device. The one or more user input devices can allow the user to interact with the portable electronic device 400. The one or more output devices can provide outputs from the portable electronic device 400 to the user or another device. The input/output component can, for example, pertain to one or more of a display, a touch screen, a touchpad, a keypad, a button, a dial, and etc.

The housing 402 of the portable electronic device 400 can also include an external connection port (not shown). The external connection port can allows the portable electronic device 400 to be connected to a host device (e.g., personal computer) or other electronic devices (e.g., docking station), so as to exchange data or to charge a battery (not shown) utilized by the portable electronic device 400.

The various aspects, features, embodiments or implementations of the invention described above can be used alone or in various combinations.

Different aspects, embodiments or implementations may, but need not, yield one or more of the following advantages. One advantage is that high precision markings can be provided to product housings. As an example, the marking being provided can have a high resolution. For example, thirty (30) micron line widths can be achieved with the marking techniques described herein. Another advantage is that the marking techniques are effective for surfaces that are flat or curved. Another advantage is that the marking is provided to an inner, protected surface yet such marking is externally visible. Still another advantage is that markings can be formed that are metallic and reflective for superior visual appearance. Yet still another advantage is that one or several markings can be provided to one or more distinct areas of a product's housing. The various markings can be efficiently provided in a sequential or concurrent manner.

Additional information on using PVD with electronic device, such as for marking or labeling, can be found in: (i) U.S. Provisional Patent Application 61/250,369, filed Oct. 9, 2009 and entitled "Method and Apparatus for Applying a Physical Vapor Deposition Material on a Substrate," which is hereby incorporated herein by reference; and (ii) U.S. Provisional Patent Application 61/236,847, filed Aug. 25, 2009 and entitled "Method and Apparatus for Applying a Physical Vapor Deposition Material on a Substrate," which is hereby incorporated herein by reference.

Additional information on electronic device housings, including electronic device housings having an outer periphery member, an internal structure and a glass cover, can be found in U.S. Provisional Application No. 61/300,780, filed Feb. 2, 2010 and entitled "HANDHELD ELECTRONIC DEVICES," which is hereby incorporated herein by reference.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An electronic device housing, comprising:
    a plurality of side surfaces for the electronic device housing;
    a glass cover mounted as a top or bottom surface for the electronic device housing, the glass cover including an inner surface and an outer surface; and
    at least one mark formed on the inner surface of the glass cover but visible from the outer surface of the glass cover,
    wherein the at least one mark is formed on the inner surface of the glass cover by (i) depositing a layer of metal onto at least a portion of the inner surface of the glass cover; (ii) applying a mask layer over select portions of the deposited layer of metal; and (iii) etching away those portions of the metal layer not protected by the mask layer, whereby one or more remaining portions of the metal layer that remain on the inner surface of the glass cover serve to provide marking for the electronic device housing.

2. An electronic device housing as recited in claim 1, wherein the electronic device housing contains at least one electronic component.

3. An electronic device housing as recited in claim 1, wherein the at least one mark is formed in part by depositing the metal layer onto the inner surface of the glass cover using Physical Vapor Deposition (PVD).

4. An electronic device housing as recited in claim 1, wherein the electronic device housing is for a handheld, portable electronic device.

5. An electronic device housing as recited in claim 4, wherein the glass cover provides an outer glass surface of the electronic device housing.

6. An electronic device housing as recited in claim 1, wherein the at least one mark includes text and at least one graphic.

7. An electronic device housing as recited in claim 1, wherein the at least one mark includes at least one graphic.

8. An electronic device housing as recited in claim 7, wherein the at least one graphic is a logo, a certification mark or an approval mark.

9. An electronic device housing as recited in claim 1, wherein the glass cover provides an outer glass surface of the electronic device housing.

10. An electronic device housing as recited in claim 1, wherein the one or more remaining portions of the metal layer that remain on the inner surface of the glass cover have a predetermined pattern.

11. An electronic device housing as recited in claim 10, wherein the glass cover provides an outer glass surface of the electronic device housing.

12. An electronic device housing as recited in claim 11, wherein the electronic device housing is for a handheld, portable electronic device.

13. An electronic device housing as recited in claim 1, wherein the metal comprises silver.

14. An electronic device housing as recited in claim 1, wherein the metal comprises aluminum.

15. An electronic device housing, comprising:
a plurality of side surfaces for the electronic device housing;
a glass cover mounted as a top or bottom surface for the electronic device housing, the glass cover including an inner surface and an outer surface; and
at least one mark formed on the inner surface of the glass cover but visible from the outer surface of the glass cover,
wherein the at least one mark is formed of metal, and
wherein the at least one mark is formed by depositing metal onto the inner surface of the glass cover using Physical Vapor Deposition (PVD).

16. An electronic device housing as recited in claim 15, wherein the electronic device housing contains at least one electronic component.

17. An electronic device housing as recited in claim 16, wherein the electronic device housing is for a handheld, portable electronic device.

18. An electronic device housing as recited in claim 15, wherein the glass cover provides an outer glass surface the electronic device housing.

19. An electronic device housing as recited in claim 15, wherein the at least one mark comprises at least one graphic.

20. An electronic device housing as recited in claim 15, wherein the at least one mark comprises text and at least one graphic.

21. An electronic device housing as recited in claim 15, wherein the metal comprises silver.

22. An electronic device housing as recited in claim 15, wherein the metal comprises aluminum.

* * * * *